(12) United States Patent
Srivastava et al.

(10) Patent No.: US 6,278,135 B1
(45) Date of Patent: Aug. 21, 2001

(54) GREEN-LIGHT EMITTING PHOSPHORS AND LIGHT SOURCES USING THE SAME

(75) Inventors: Alok Mani Srivastava, Schenectady, NY (US); William Winder Beers, Chesterland, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/144,137

(22) Filed: Aug. 31, 1998

Related U.S. Application Data

(60) Provisional application No. 60/073,935, filed on Feb. 6, 1998.

(51) Int. Cl.$^7$ .................................................. H01L 33/00
(52) U.S. Cl. .............................. 257/98; 257/97; 257/99; 257/89
(58) Field of Search .................... 257/98, 97, 99, 257/89; 315/56; 313/487, 637; 250/582; 607/88; 606/9, 11

(56) References Cited

U.S. PATENT DOCUMENTS

| | | |
|---|---|---|
| 4,423,349 | 12/1983 | Nakajima et al. . |
| 4,900,933 * | 2/1990 | Nestor et al. ..................... 250/458.1 |
| 5,185,553 | 2/1993 | Yang et al. . |
| 5,523,018 | 6/1996 | Okada et al. . |
| 5,578,839 | 11/1996 | Nakamura et al. ..................... 257/96 |
| 5,607,621 | 3/1997 | Ishihara et al. . |
| 5,665,793 | 9/1997 | Anders . |
| 5,813,752 | 9/1998 | Singer et al. ......................... 362/293 |
| 5,838,101 * | 11/1998 | Pappalardo ........................... 313/487 |
| 6,048,250 * | 7/2000 | Justel et al. ........................... 257/89 |

FOREIGN PATENT DOCUMENTS 9839805    9/1998  (WO) .

OTHER PUBLICATIONS

G. Blasse and A. Bril, Fluorescence of Eu2+ Activated Alkaline Earth Aluminates, 23 Philips Res. Repts. 201–206 (1968).

G. Blasse et al., Fluorescence of Eu2+ Activated Silicates, 23 Philips Res. Repts. 189–200 (1968).

G. Blasse and B.C. Grabmaier, Luminescent Materials, 112–131 (Springer–Verlag 1994).

Cunningham et al., Engineering Technology Division of the Oak Ridge National Labaoratory, ORNL/ATD–70, DE93 011459, Jan. 1993, "Thermographic Properties of Eight Blue–Emitting Phosphors", pp. 1–47.

* cited by examiner

Primary Examiner—Matthew Smith
Assistant Examiner—Igwe W. Anya
(74) Attorney, Agent, or Firm—Toan P. Vo; Noreen C. Johnson

(57) ABSTRACT

A phosphor composition absorbs ultraviolet radiation and emits a green visible light. The phosphor composition comprises at least one of: $Ba_2SiO_4:Eu^{2+}$; $Ba_2MgSi_2O_7:Eu^{2+}$; $Ba_2ZnSi_2O_7:Eu^{2+}$; $BaAl_2O_4:Eu^{2+}$; $SrAl_2O_4:Eu^{2+}$; and $BaMg_2Al_{16}O_{27}:Eu^{2+},Mn^{2+}$. Further, when the green-light emitting phosphor is combined with appropriate red and blue phosphors in a phosphor conversion material blend, and the phosphor conversion material blend absorbs ultraviolet radiation, and emits a bright white light with high brightness and quality. The ultraviolet radiation source may comprise a semiconductor ultraviolet radiation source.

28 Claims, 1 Drawing Sheet

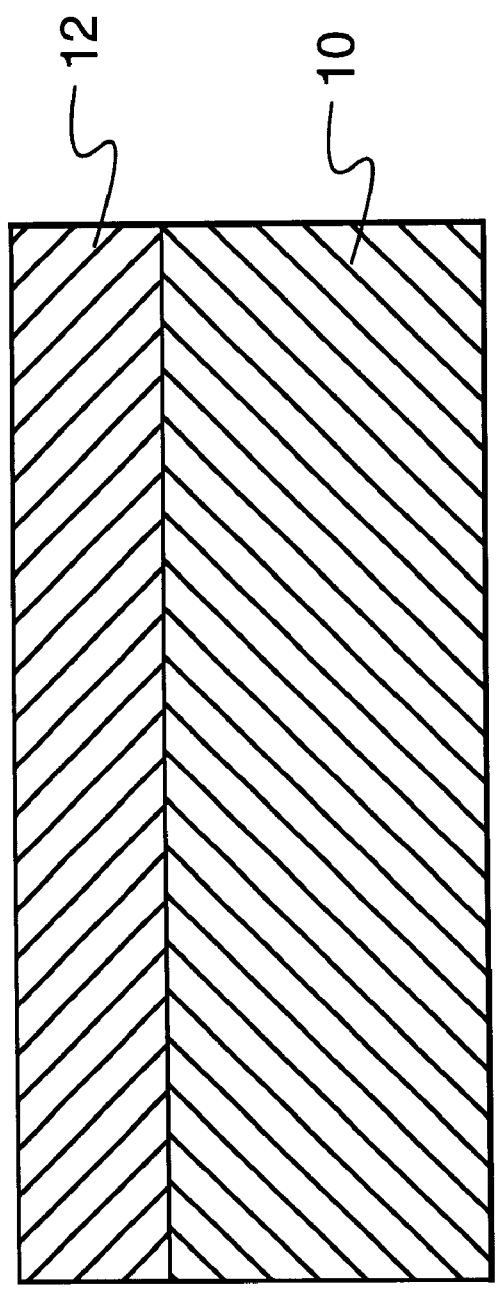

GREEN-LIGHT EMITTING PHOSPHORS AND LIGHT SOURCES USING THE SAME

This application claims priority to U.S. Provisional Application No. 60/073,935, filed Feb. 6, 1998.

FIELD OF THE INVENTION

The invention relates to phosphors. In particular, the invention relates to green light emitting phosphor compositions for light emitting diodes.

BACKGROUND OF THE INVENTION

Semiconductor light emitters are well known in the art. Semiconductor light emitters include light emitting diodes (LEDs) and semiconductor lasers. LEDs are devices of choice for many display applications because of advantages LEDs possess over other light sources. These advantages include a single relative size, a low operating current, an inherently colored light, a low power consumption, a long life, a maintained high efficiency (power in versus light output), an acceptable dispersal of light, and a relatively low cost of manufacture compared to other light sources.

Applications for LEDs include the replacement of light sources, such as incandescent lamps, especially where a colored light source is needed. LEDs are often used as display lights, warning lights and indicating lights. This colored light source application arises from an LED emitting radiation that produces an inherently colored light. The colored light from an LED is dependent on the type of semiconductor material relied upon and its physical characteristics. The LED has not been acceptable for lighting uses where a bright white light is needed, due to the inherent color.

LEDs rely on a semiconductor to emit light. The light is emitted as a result of electronic excitation of the semiconductor material. As radiation (energy) strikes atoms of the semiconductor material, an electron of an atom is excited and jumps to an excited (higher) energy state. (The higher and lower energy states in semiconductor light emitters are characterized as the conduction band and the valence band, respectively.) The electron, as it returns to its un-excited (lower) energy state, emits a photon. The photon corresponds to an energy difference between the excited state and lower energy state, and results in an emission of radiation, often with an optical wavelength. The methods for exciting electrons vary for semiconductor light emitters; however, one method is excitation by the well-known method of injection electroluminescence.

Semiconductors are generally classified into three types, p-type, n-type and intrinsic semiconductors. Intrinsic semiconductors comprise either p-type or n-type semiconductors, and are formed by introducing impurities (dopants) of p-type (donor) or n-type (acceptor), respectively. In an n-type semiconductor, electron conduction (negative charge) exceeds acceptor hole (absence of electrons) concentration and electronic conduction is by donor electrons. In a p-type semiconductor, the hole concentration exceeds the electrons, and conduction is by acceptor holes.

Semiconductor light emitting devices are essentially characterized by p-type material and n-type material having a pn-junction therebetween or within p-type and n-type material regions. At equilibrium, no light is emitted by the semiconductor light emitting device. If electrons from the n-type material are energized into the conduction band over holes of the p-type material, electrons are excited. Electrons, once excited, will relax from their excited energy level at the conduction band to the valence band. The relaxation results in radiation (photon) emission. The radiation is normally ultraviolet radiation with about a 370 nm wavelength, which is not visible to the human eye. Radiation, to be visible light, must possess a wavelength within the visible spectrum. Phosphors are commonly used to convert non-visible radiation into visible radiation.

While semiconductor light emitting devices, such as LED light sources, have versatile and wide spread applications, LED light sources possess some undesirable characteristics. Most notably, LED light sources are not white light sources. At least three individual and separate LEDs must be combined to produce a somewhat whitish light. The individual and separate LEDs require a separate green LED, a separate red LED, and a separate blue LED.

The use of phosphors has been attempted for converting LED radiation into visible light. For example, one yellow-whitish light emitting LED comprises a blue-light emitting LED, which has an emission wavelength equal to about 450 nm, provided with a yellow-light emitting phosphor, such as for example $Y_3Al_5O_{12}$—$Ce^{3+}$, (YAG-Ce). The yellow-light emitting phosphor absorbs radiation emitted from the LED, and converts the absorbed radiation to a yellow-whitish light.

Color temperature is a standard used to compare the color of various light, for example fluorescent, incandescent, and other light types. Color temperature is related to a temperature of black body that would give an equivalent tone of white light. In general, a lower color temperature is indicative of a redder tone of the white light. Conversely, a higher color temperature is indicative of a bluer tone of white light. There is no individual specific lamp component having a temperature equal to or determinative of the color temperature. For the yellow-whitish light described above, the color temperature falls in a range between about 6000 Kelvin to about 8000 Kelvin, with a resultant a color rendering index (CRI) less than about 85. The lumens per watt (LPW) of the above-described LED are in a range of about 5 LPW to about 10 LPW.

LED radiation at about 5 LPW to about 10 LPW with a CRI less than about 85 is not acceptable for lighting applications. Most lighting applications require a LPW that is at least 15 LPW, with a CRI maintained at or above 85, to increase the light source efficiency. Further, known LED light sources do not provide a single LED with a sufficient LPW and CRI for most generalized lighting applications especially for white light.

Green light emitting LEDs have been difficult to develop, even though acceptable yellow and red light emitting LEDs are well-known. Green light emitting LEDs are limited because they possess several undesirable shortcomings. These green LEDs possess a low intensity, brightness, and power, so their lights are not sharp and bright, nor are they high-quality (possessing wavelengths at or near the midpoint of the wavelength range for the particular color). Further, their emitted lights are not tuned at wavelengths to be combined with other light sources, such as red and blue, to provide a bright white light.

Therefore, a high-quality green light emitting LED is needed. The high-quality green light emitting LED should possess sufficient intensity, brightness, and color for lighting applications, including lamps, energizing lights, exit signs and the like.

SUMMARY OF THE INVENTION

Accordingly, it is desirable to overcome the above-noted deficiencies.

A phosphor composition that absorbs ultraviolet radiation and emits a visible light is provided in one embodiment of the invention. The phosphor composition comprises at least one of: $Ba_2SiO_4:Eu^{2+}$, $Ba_2MgSi_2O_7:Eu^{2+}$, $Ba_2ZnSi_2O_7:Eu^{2+}$, $BaAl_2O_4:Eu^{2+}$, $SrAl_2O_4:Eu^{2+}$, and $BaMg_2Al_{16}O_{27}:Eu^{2+},Mn^{2+}$. The phosphor composition absorbs ultraviolet radiation and emits green light.

Further, the invention also sets forth a phosphor conversion material blend that absorbs ultraviolet radiation and emits a bright white light with high intensity and brightness. The phosphor conversion material blend comprises a green-light emitting phosphor composition in combination with red-light and blue-light emitting phosphors, where the green-light emitting phosphor comprises at least one of: $Ba_2SiO_4:Eu^{2+}$, $Ba_2MgSi_2O_7:Eu^{2+}$, $Ba_2ZnSi_2O_7:Eu^{2+}$, $BaAl_2O_4:Eu^{2+}$, $SrAl_2O_4:Eu^{2+}$, and $BaMg_2Al_{16}O_{27}:Eu^{2+}, Mn^{2+}$.

These and other aspects, advantages and salient features of the invention will become apparent from the following detailed description, which, when taken in conjunction with the annexed drawings, where the reference characters represent like elements, disclose embodiments of the invention.

BRIEF DESCRIPTION OF THE INVENTION

The FIGURE illustrates an example of an light emitting assembly.

DETAILED DESCRIPTION OF THE INVENTION

Phosphors convert radiation (energy) to visible light. Different combinations of phosphors absorb different radiations and provide different colored light emissions. The colored light that originates from the phosphors provides a color temperature.

A fluorescent lamp conversion material blend (material blend) converts radiation generated by a fluorescent lamp to visible light. A blend material is used regardless of the desired intensity and "color" of the desired fluorescent light. The material blend may include more of one of phosphors, for example more of at least one of red, green and blue phosphors.

Fluorescent lamp conversion material blends absorb radiation at a wavelength of about 254 nm (ultraviolet). The radiation in fluorescent lamps is produced by excited photons, which are normally generated by a mercury plasma. The fluorescent light is produced by the fluorescent lamp conversion material absorbing the radiation and subsequently emitting energy with visible wavelength. These known fluorescent lamp conversion material blends do not contain appropriate materials to convert radiations with a wavelength other than about 254 nm. The failure is due, at least in part, to the material blend being specifically developed to convert radiation only at about 254 nm to visible light.

Known green-light emitting fluorescent materials include, but are not limited to: terbium-cerium (Tb—Ce) activated magnesium aluminate; Tb—Ce activated yttrium silicate; Tb-activated yttrium silicate; copper and aluminum activated zinc sulphide phosphor (ZnS:CuAl); a copper and aluminum activated zinc-cadmium sulphide phosphor (ZnCd)S:CuAl); and a copper, gold and aluminum activated zinc sulphide phosphor (ZnS:CuAuAl). These green-light emitting fluorescent materials are tuned to absorb radiation at about 254 nm, and convert it into a visible light. Most green-light emitting fluorescent materials have some desirable qualities, but are accompanied with undesirable traits.

For example, aluminate materials for use in fluorescent phosphor materials are baked at extremely high temperatures, such as in a range between about 1350° to about 1500° C. to make it usable in fluorescent applications. Further, these aluminate materials are baked for long time periods. Consequently, production of aluminate materials involves large amounts of time and energy, and is costly. Other undesirable traits of known fluorescent green-light emitting phosphors are discussed in U.S. Pat. No. 5,185,553.

In the following discussion, the wavelength of the radiation of the ultraviolet radiation source, such as an LED, is described as 370 nm. However, this is merely exemplary of the wavelengths from an LED of radiation source. For example, an LED has a wavelength in a range between about 330 and about 400 nm, such as in a range between about 350 and 400 nm. Also, an LED radiation, has a wavelength in a range between about 365 and about 375 nm. In particular, the wavelength is about 370 nm. The ultraviolet radiation source is discussed below with respect to an LED, however, this is merely exemplary and not meant to limit the invention in any way. Other ultraviolet radiation sources emitting similar radiations such as, but not limited to, a semiconductor laser, are within the scope of the invention.

The above-described green-light emitting fluorescent materials are tuned to absorb radiation at about 254 nm, which is normally produced in fluorescent lamps. These green-light emitting fluorescent materials do not absorb radiation produced at other wavelengths so as to emit visible light. For example, the above-described green-light emitting materials do not absorb ultraviolet 8 radiation, such as ultraviolet energy with a wavelength in a range between about 330 and about 400 nm as emitted by an LED.

In order to provide a green-light-emitting phosphor composition for ultraviolet applications, known fluorescent green-light emitting phosphor compositions are activated by the incorporation of at least one sensitizer (activator). The sensitizer comprises, but is not limited to, one of a suitable rare earth and a transition metal ion.

One sensitizer for a green-light emitting phosphor comprises divalent europium ($Eu^{2+}$). The conversion of ultraviolet radiation is based on a luminescence (excitation) of divalent europium in solids. Phosphor compositions comprising divalent europium are efficient converters of the ultraviolet radiation at about 370 nm, such as from an LED, into green visible light.

Green-light emitting phosphors, as embodied by the invention, are listed in Table 1. These green-light emitting phosphors generate an efficient high-quality (light with a wavelength approximately in a range of wavelengths for the particular light) is intense green-light when excited by ultraviolet radiation. Table 1 also lists an emission wavelength at which a visible light peak is generated for each phosphor. The wavelengths given are provided in nanometers and the lengths are approximate.

TABLE 1

| COMPOSITION | EMISSION WAVELENGTH (nm) |
|---|---|
| $Ba_2SiO_4:Eu^{2+}$ | 505 |
| $Ba_2MgSi_2O_7:Eu^{2+}$ | 500 |
| $Ba_2ZnSi_2O_7:Eu^{2+}$ | 505 |
| $BaAl_2O_4:Eu^{2+}$ | 505 |
| $SrAl_2O_4:Eu^{2+}$ | 520 |
| $BaMg_2Al_{16}O_{27}:Eu^{2+},Mn^{2+}$ | 515 |

The green-light emitted by $Ba_2SiO_4:Eu^{2+}$, $Ba_2MgSi_2O_7:Eu^{2+}$, $Ba_2ZnSi_2O_7:Eu^{2+}$, and $BaAl_2O_4:Eu^{2+}$ is saturated in green color by adding a further activator, in addition to a $Eu^{2+}$ activator. The further activator comprises $Mn^{2+}$ and is positioned in tetrahedral holes of the phosphor. The $Mn^{2+}$ saturates (shifts) the emissions of the green light towards a deeper green light, with a longer wavelength. For example, the $Mn^{2+}$ will shift the emitted green light to a wavelength in the range between about 515 nm to about 520 nm.

One or more of the above described green-light emitting phosphors can be used in combination with an ultraviolet source, for example an LED, to generate a green visible light. The numbers and types of phosphors depends on desired quality of the green light.

In one embodiment of the invention, a luminescent material phosphor conversion material blend (phosphor conversion material blend) is provided to convert radiation from an ultraviolet radiation source, such as, but not limited to, an LED, into visible bright white light. The phosphor conversion material blend comprises at least one red-light emitting phosphor, at least one green light emitting phosphor, and at least one blue-light emitting phosphor, all of which can absorb ultraviolet radiation from an appropriate source, such as an LED, and convert it into visible light. The green-light emitting phosphor in the phosphor conversion material blend comprises at least one $Ba_2SiO_4:Eu^{2+}$; $Ba_2MgSi_2O_7:Eu^{2+}$; $Ba_2ZnSi_2O_7:Eu^{2+}$; $BaAl_2O_4:Eu^{2+}$; $SrAl_2O_4 Eu^{2+}$; and $BaMg_2Al_{16}O_{27}:Eu^{2+},Mn^{2+}$, as embodied by the invention. The red-light emitting phosphor and the blue-light emitting phosphor comprise any appropriate available phosphors that convert ultraviolet radiation, such as from an LED, and convert it into appropriately colored visible light. The individual phosphors and the phosphor conversion material blend including the individual phosphors convert radiation a specified wavelength, for example radiation at about 370 nm as emitted by an LED, into visible light. The visible light when provided by phosphor conversion material blend comprises a bright white light with high intensity and brightness.

The FIGURE illustrates an exemplary light emitting assembly 1, in accordance with one embodiment of the invention. The light emitting assembly 1 comprises a semiconductor ultraviolet radiation source, such as a phosphor conversion LED 10, and the phosphor conversion material blend 12. The phosphor conversion material blend 12 comprises at least one red-light emitting phosphor, at least one green light emitting phosphor, and at least one blue-light emitting phosphor, where the green-light emitting phosphor comprises at least one of $Ba_2SiO_4:Eu^{2+}$; $Ba_2MgSi_2O_7:Eu^{2+}$; $Ba_2ZnSi_2O_7:Eu^{2+}$; $BaAl_2O_4:Eu^{2+}$; $SrAl_2O_4:Eu^{2+}$; and $BaMg_2Al_{16}O_{27}:Eu^{2+},Mn^{2+}$, as embodied by the invention. The phosphor conversion material blend 12 is radiationally coupled to the LED 10 to receive radiation from the LED 10. Radiationally coupled means that the elements are associated with each other so radiation from one is transmitted to the other. The phosphor conversion material blend 12 is deposited on the LED 10 by any appropriate method, such as, but not limited to, applying the red, green, and blue phosphors together. For example, a water based suspension of the three phosphors can be formed, and applied to an LED surface. This method is merely exemplary of possible positioning of the phosphor conversion material blend 12 and LED 10. Alternatively, the phosphor conversion material blend 12 can be placed on a cover, lens or other optical feature associated with the LED 10 to absorb and convert energy as long as the phosphor conversion material blend 12 is radiationally coupled to the LED 10.

While the embodiments are described herein, it will be appreciated from the specification that various combinations of elements, variations or improvements therein may be made by those skilled in the art are within the scope of the invention.

What is claimed is:

1. A light source comprising:
    a light emitting diode which emits ultraviolet light; and
    a phosphor composition that is capable of absorbing ultraviolet radiation and emitting visible light, the phosphor composition comprising at least one of: $Ba_2SiO_4:Eu^{2+}$; $Ba_2MgSi_2O_7:Eu^{2+}$, $Ba_2ZnSi_2O_7:Eu^{2+}$; $BaAl_2O_4:Eu^{2+}$; $SrAl_2O_4:Eu^{2+}$; and $BaMg_2Al_{16}O_{27}:Eu^{2+}$.

2. The light source according to claim 1, wherein the $Ba_2SiO_4:Eu^{2+}$; $Ba_2MgSi_2O_7:Eu^{2+}$, $Ba_2ZnSi_2O_7:Eu^{2+}$; and $BaAl_2O_4:Eu^{2+}$ each further comprise $Mn^{2+}$ as an additional activator.

3. The light source according to claim 1, wherein the phosphor composition is capable of emitting green light.

4. The light source according to claim 1, wherein $Ba_2SiO_4:Eu^{2+}$ emits a green light with a wavelength of about 505 nm; $Ba_2MgSi_2O_7:Eu^{2+}$ emits a green light with a wavelength of about 500 nm; $Ba_2ZnSi_2O_7:Eu^{2+}$ emits a green light with a wavelength of about 505 nm; $BaAl_2O_4:Eu^{2+}$ emits a green light with a wavelength of about 505 nm; $SrAl_2O_4:Eu^{2+}$ emits a green light with a wavelength of about 520 nm; and $BaMg_7Al_{16}O_{27}:Eu^{2+}$, $Mn^{2+}$ emits a green light with a wavelength of about 515 nm.

5. The light source according to claim 1, wherein the phosphor composition absorbs ultraviolet radiation with a wavelength in a range between about 330 un and about 400 rum.

6. The light source according to claim 1, wherein the phosphor composition absorbs ultraviolet radiation with a wavelength in a range between about 350 nm and about 400 nm.

7. The light source according to claim 1, wherein the phosphor composition absorbs ultraviolet radiation with a wavelength in a range between about 365 nm and about 375 nm.

8. The light source according to claim 1, wherein the phosphor composition absorbs ultraviolet radiation with a wavelength at about 370 nm.

9. The light source of claim 1, wherein the phosphor composition comprises $Ba_2SiO_4:Eu^{2+}$.

10. The light source of claim 1, wherein the phosphor composition comprises $Ba_2MgSi_2O_7:Eu^{2+}$.

11. The light source of claim 1, wherein the phosphor composition comprises $Ba_2ZnSi_2O_7:Eu^{2+}$.

12. The light source of claim 1, wherein the phosphor composition comprises $BaAl_2O_4:Eu^{2+}$.

13. The light source of claim 1, wherein the phosphor composition comprises $SrAl_2O_4:Eu^{2+}$.

14. The light source of claim 1, wherein the phosphor composition comprises $BaMg_2Al_{16}O_{27}:Eu^{2+}$.

15. A light emitting diode that is capable of absorbing ultraviolet radiation and emitting a green visible light, the light emitting diode comprising:
    a semiconductor radiation source; and
    a phosphor comprising at least one of $Ba_2SiO_4:Eu^{2+}$; $Ba_2MgSi_2O_7:Eu^{2+}$, $Ba_2ZnSi_2O_7:Eu^{2+}$; $BaAl_2O_4:Eu^{2+}$; $SrAl_2O_4:Eu^{2+}$; and $BaMg_2Al_{16}O_{27}:Eu^{2+},Mn^{2+}$.

16. The light emitting diode according to claim 15, wherein the $Ba_2SiO_4:Eu^{2+}$; $Ba_2MgSi_2O_7:Eu^{2+}$; $Ba_2ZnSi_2O_7:Eu^{2+}$; and $BaAl_2O_4:Eu^{2+}$ each further comprises $Mn^{2+}$ an additional activator.

17. A light emitting diode that is capable of absorbing ultraviolet radiation and absorbs emitting a green visible light, the light emitting diode comprising:

a semiconductor radiation source; and a phosphor comprising at least one of:

$Ba_2SiO_4:Eu^{2+}$; $Ba_2MgSi_2O_7:Eu^{2+}$; $Ba_2ZnSi_2O_7:Eu^{2+}$; $BaAl_2O_4:Eu^{2+}$; $SrAl_2O_4:Eu^{2+}$; and $BaMg_2Al_{16}O_{27}:Eu^{2+}$, $Mn^{2+}$, wherein $Ba_2SiO_4:Eu^{2+}$ emits a green light with a wavelength about 505 nm; $Ba_2MgSi_2O_7:Eu^{2+}$ emits a green light with a wavelength about 500 nm; $Ba_2ZnSi_2O_7:Eu^{2+}$ emits a green light with a wavelength about 505 nm; $BaAl_2O_4:Eu^{2+}$ emits a green light with a wavelength about 505 nm; $SrAl_2O_4:Eu^{2+}$ emits a green light with a wavelength about 520 nm; and $BaMg_2Al_{16}O_{27}:Eu^{2+},Mn^{2+}$ emits a green light with a wavelength about 515 nm.

18. The light emitting diode according to claim 17, wherein the phosphor absorbs ultraviolet radiation with a wavelength in a range between about 330 nm and about 400 nm.

19. The light emitting diode according to claim 17, wherein the phosphor absorbs ultraviolet radiation with a wavelength in a range between about 350 nm and about 400 nm.

20. The light emitting diode according to claim 17, wherein the phosphor absorbs ultraviolet radiation with a wavelength in a range between about 365 nm and about 375 nm.

21. The light emitting diode according to claim 17, wherein the phosphor absorbs ultraviolet radiation with a wavelength at about 370 nm.

22. A light emitting diode that is capable of emitting a white visible light, the light emitting diode comprising:

a semiconductor radiation source; and a phosphor conversion material blend composition comprising:

at least one red-light emitting phosphor;

at least one blue-light emitting phosphor; and at least one green-light emitting phosphor selected from the group consisting of: $Ba_2SiO_4:Eu^{2+}$; $Ba_2MgSi_2O_7:Eu^{2+}$; $Ba_2ZnSi_2O_7:Eu^{2+}$; $BaAl_2O_4:Eu^{2+}$; $SrAl_2O_4:Eu^{2+}$; and $BaMg_2Al_{16}O_{27}:Eu^{2+},Mn^{2+}$.

23. The light emitting diode according to claim 22, wherein the $Ba_2SiO_4:Eu^{2+}$; $Ba_2MgSi_2O_7:Eu^{2+}$; $Ba_2ZnSi_2O_7:Eu^{2+}$; and $BaAl_2O_4:Eu^{2+}$ each further comprise $Mn^{2+}$ an additional activator.

24. A light emitting diode that is capable of absorbing ultraviolet radiation and emitting the ultraviolet radiation into a white visible light, the light emitting diode comprising:

a semiconductor radiation source; and a phosphor conversion material blend composition comprising:

at least one red-light emitting phosphor;

at least one blue-light emitting phosphor; and at least one green-light emitting phosphor selected from the group consisting of:

$Ba_2SiO_4:Eu^{2+}$; $Ba_2MgSi_2O_7:Eu^{2+}$; $Ba_2ZnSi_2O_7:Eu^{2+}$; $BaAl_2O_4:Eu^{2+}$; $BaAl_2O_4:Eu^{2+}$; $SrAl_2O_4:Eu^{2+}$; and $BaMg_2Al_{16}O_{27}:Eu^{2+},Mn^{2+}$, wherein $Ba_2SiO_4:Eu^{2+}$ emits a green light with a wavelength about 505 nm; $Ba_2MgSi_2O_7:Eu^{2+}$ emits a green light with a wavelength about 500 nm; $Ba_2ZnSi_2O_7:Eu^{2+}$ emits a green light with a wavelength about 505 nm; $BaAl_2O_4:Eu^{2+}$ emits a green light with a wavelength about 505 nm; $SrAl_2O_4:Eu^{2+}$ emits a green light with a wavelength about 520 nm; and $BaMg_2Al_{16}O_{27}:Eu^{2+},Mn^{2+}$ emits a green light with a wavelength about 515 nm.

25. The light emitting diode according to claim 24, wherein the at least one green-light emitting phosphor absorbs ultraviolet radiation with a wavelength in a range between about 330 nm and about 400 nm.

26. The light emitting diode according to claim 24, wherein the at least one green-light emitting phosphor absorbs ultraviolet radiation with a wavelength in a range between about 350 nm and about 400 nm.

27. The light emitting diode according to claim 24, wherein the at least one green-light emitting phosphor absorbs ultraviolet radiation with a wavelength in a range between about 365 nm and about 375 nm.

28. The light emitting diode according to claim 24, wherein the at least one green-light emitting phosphor absorbs ultraviolet radiation with a wavelength at about 370 nm.

* * * * *